(12) United States Patent
Maynard et al.

(10) Patent No.: US 8,431,495 B2
(45) Date of Patent: Apr. 30, 2013

(54) STENCIL MASK PROFILE

(75) Inventors: Helen Maynard, North Reading, MA (US); George Papasouliotis, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 356 days.

(21) Appl. No.: 12/832,160

(22) Filed: Jul. 8, 2010

(65) Prior Publication Data

US 2012/0009798 A1    Jan. 12, 2012

(51) Int. Cl.
*H01L 21/00*    (2006.01)

(52) U.S. Cl.
USPC ............ 438/785; 438/29; 438/712; 438/799; 257/98; 257/194; 257/410; 257/E21.482

(58) Field of Classification Search ............ 257/98, 257/194, 260, 410, 618, E21.482; 438/29, 438/712, 725, 738, 758, 799
See application file for complete search history.

(56) References Cited

U.S. PATENT DOCUMENTS 6,095,041 A    8/2000    Comino et al.

*Primary Examiner* — Evan Pert
*Assistant Examiner* — Mark A Laurenzi

(57) ABSTRACT

An apparatus and method are provided which allow the low cost patterned deposition of material onto a workpiece. A stencil mask, having chamfered edges is applied to the surface of the workpiece. The material is then deposited onto the workpiece, such as by PECVD. Because of the chamfered edges, the material thickness is much more uniform than is possible with traditional stencil masks. Stencil masks having a variety of cross sectional patterns are disclosed which improve deposition uniformity.

6 Claims, 5 Drawing Sheets

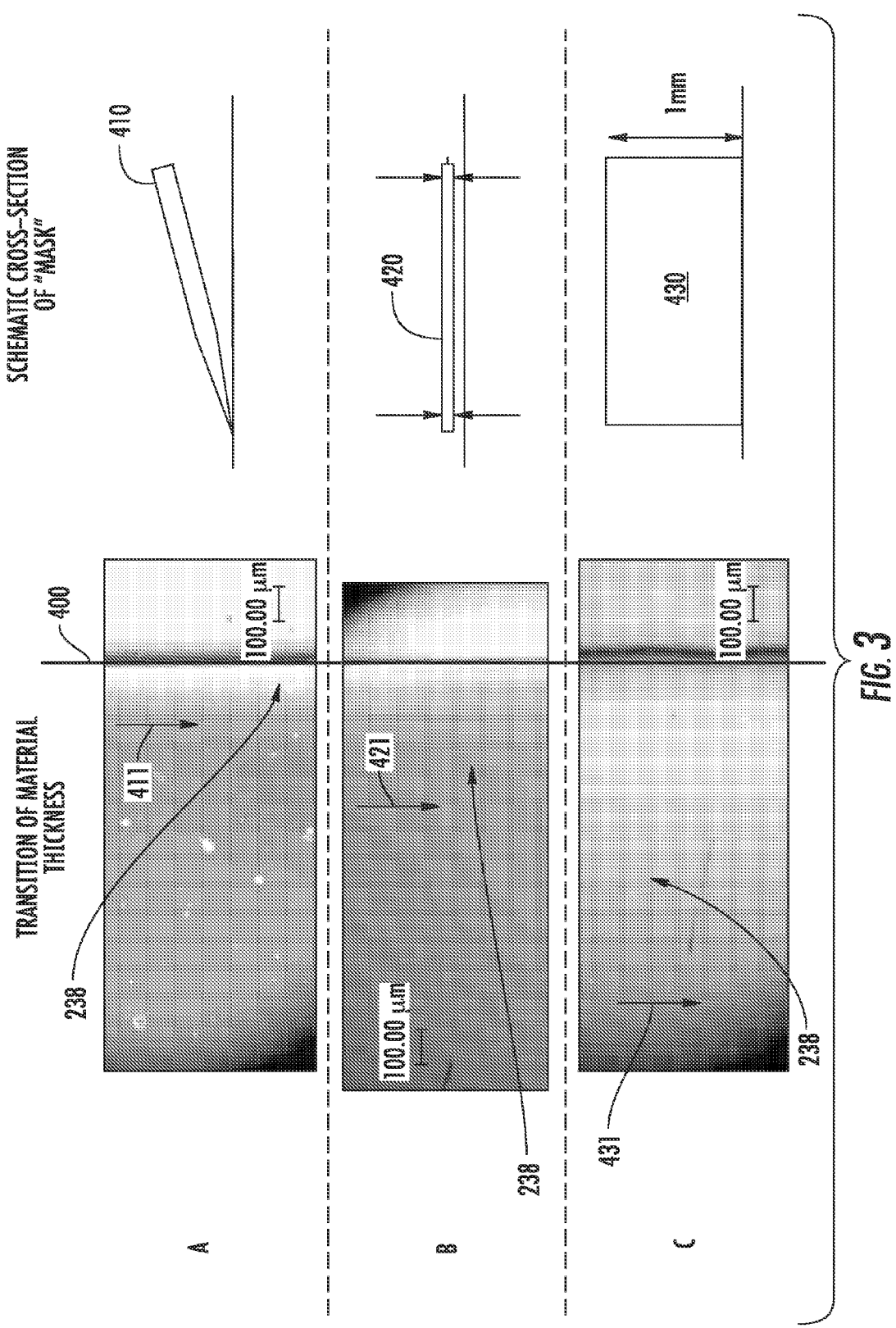

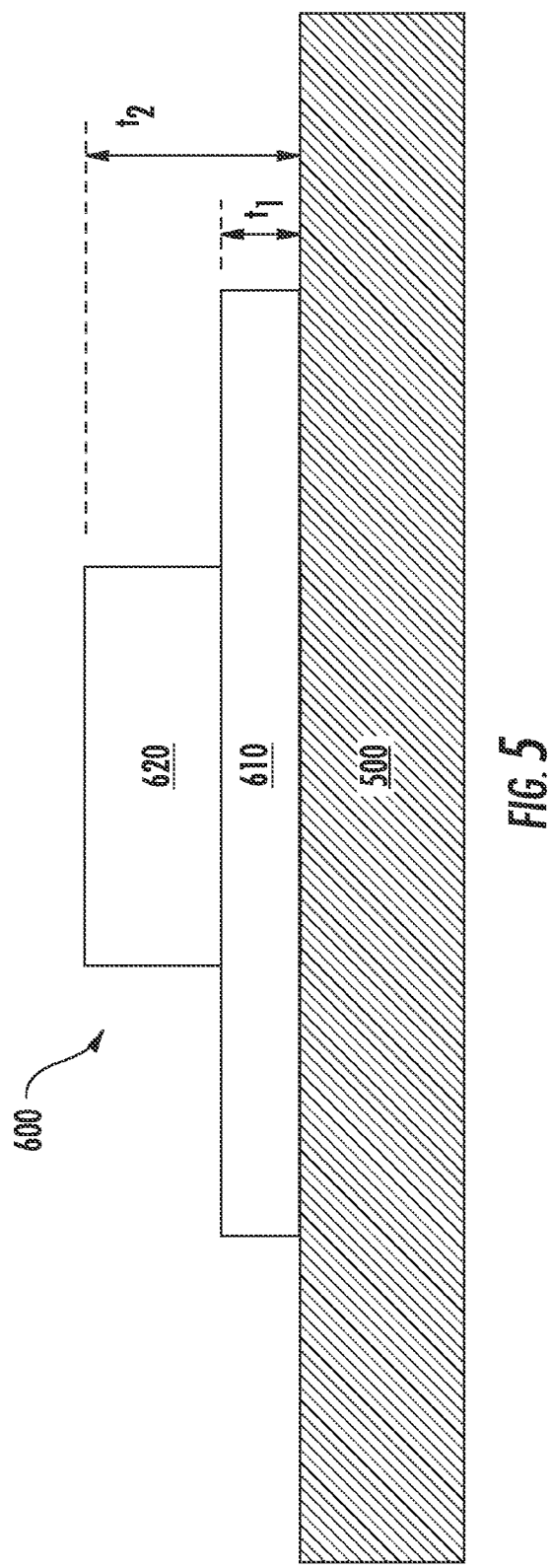

STENCIL MASK PROFILE

BACKGROUND

In the production of semiconductor devices, such as integrated circuits and solar cells, various processes may be used. For example, ions of a particular species may be implanted into a workpiece to modify the electrical characteristics of that workpiece. In other embodiments, a particular species may be used to etch material on the workpiece to create features thereon. In yet other embodiments, a species may be deposited on the workpiece, for example, as a coating. One particular example of a deposition process is the addition of a layer of silicon nitride ($SiN_x$) as an antireflective top layer for solar cells.

One mechanism to perform these various semiconductor processes is the use of a plasma processing apparatus. A plasma processing apparatus generates a plasma in a process chamber for treating a workpiece supported by a platen in the process chamber. A plasma processing apparatus may include, but not be limited to, doping systems, etching systems, and deposition systems. The plasma is generally a quasi-neutral collection of ions (usually having a positive charge) and electrons (having a negative charge). The plasma has an electric field of about 0 volts per centimeter in the bulk of the plasma. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

Turning to FIG. 1, a block diagram of one exemplary plasma processing apparatus 100 is illustrated. The plasma doping apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma doping apparatus 100 may further includes a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma doping apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 350 to the RF antennas 126, 146.

The plasma doping apparatus may also include a bias power supply 190 electrically coupled to the platen 134. The plasma doping system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma doping apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

To implant ions in to the workpiece, the bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy.

In the case of deposition, also known as Plasma Enhanced Chemical Vapor Deposition or PECVD, the bias power supply 190 is typically not activated, allowing the ions and neutrals to drift onto the workpiece. PECVD may be used for the deposition of dielectric films and passivation films, such as but not limited to silicon oxide and silicon nitride.

In some embodiments, it is desirable to deposit material on only a portion of the surface of the workpiece. There are various methods that can be used to accomplish this. For example, one method is the use of photolithography. In this method, a photoresist material is applied to the workpiece on the areas upon which material is not to be deposited. The photoresist may be baked onto the workpiece to ensure that it remains in place. The deposition step is then performed. Afterwards, the photoresist must be removed. Often, there are several cleaning steps also required in this process.

A simpler lower cost alternative is the use of stencil masks. A stencil mask is placed atop the workpiece. The deposition process is then performed, and the material is deposited only on the areas of the workpiece that are exposed. After completion, the stencil mask is simply removed.

However, the use of stencil mask for deposition processes, especially in plasma processing chambers, also has drawbacks. For example, it has been shown that the thickness of the deposition layer, deposited using a stencil mask, is not uniform across the surface of the workpiece. Therefore, an apparatus and method that allows low cost patterned deposition, especially PECVD, is beneficial.

SUMMARY

An apparatus and method are provided which allow the low cost patterned deposition of material onto a workpiece. A stencil mask, having chamfered edges is applied to the surface of the workpiece. The material is then deposited onto the workpiece, such as by PECVD. Because of the chamfered edges, the thickness of the deposited is much more uniform than is possible with traditional stencil masks. Stencil masks having a variety of cross sectional patterns are disclosed which improve deposition uniformity.

BRIEF DESCRIPTION OF THE DRAWINGS

For a better understanding of the present disclosure, reference is made to the accompanying drawings, in which like elements are referenced with like numerals, and in which:

FIGS. 3A-C show the thickness of the deposited material as a function of the stencil mask used;

FIG. 5 shows another embodiment of a stencil mask in accordance with the disclosure.

DETAILED DESCRIPTION

Figure 1:
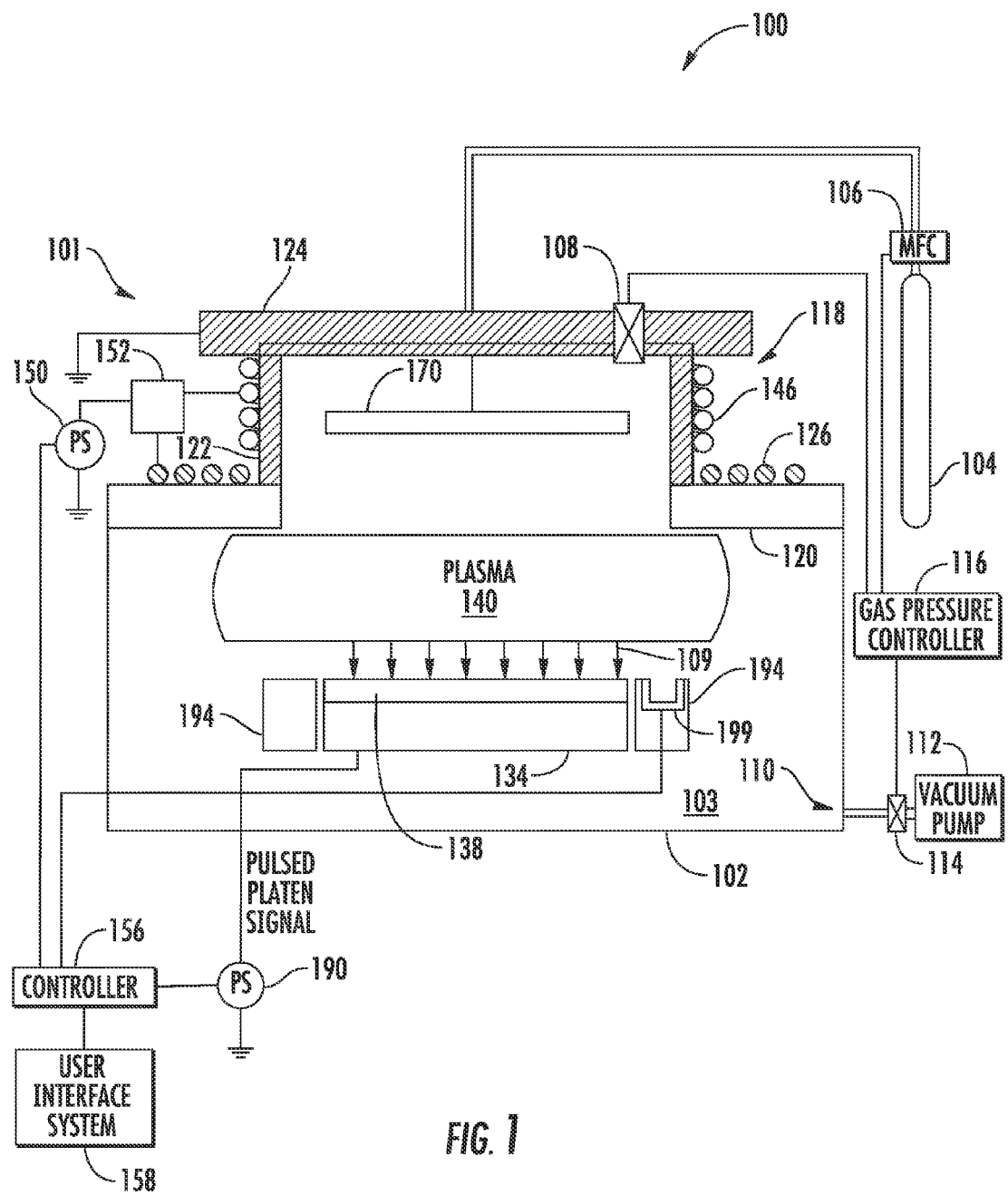
FIG. 1 is a block diagram of a plasma processing apparatus consistent with the disclosure.
Figure 2:
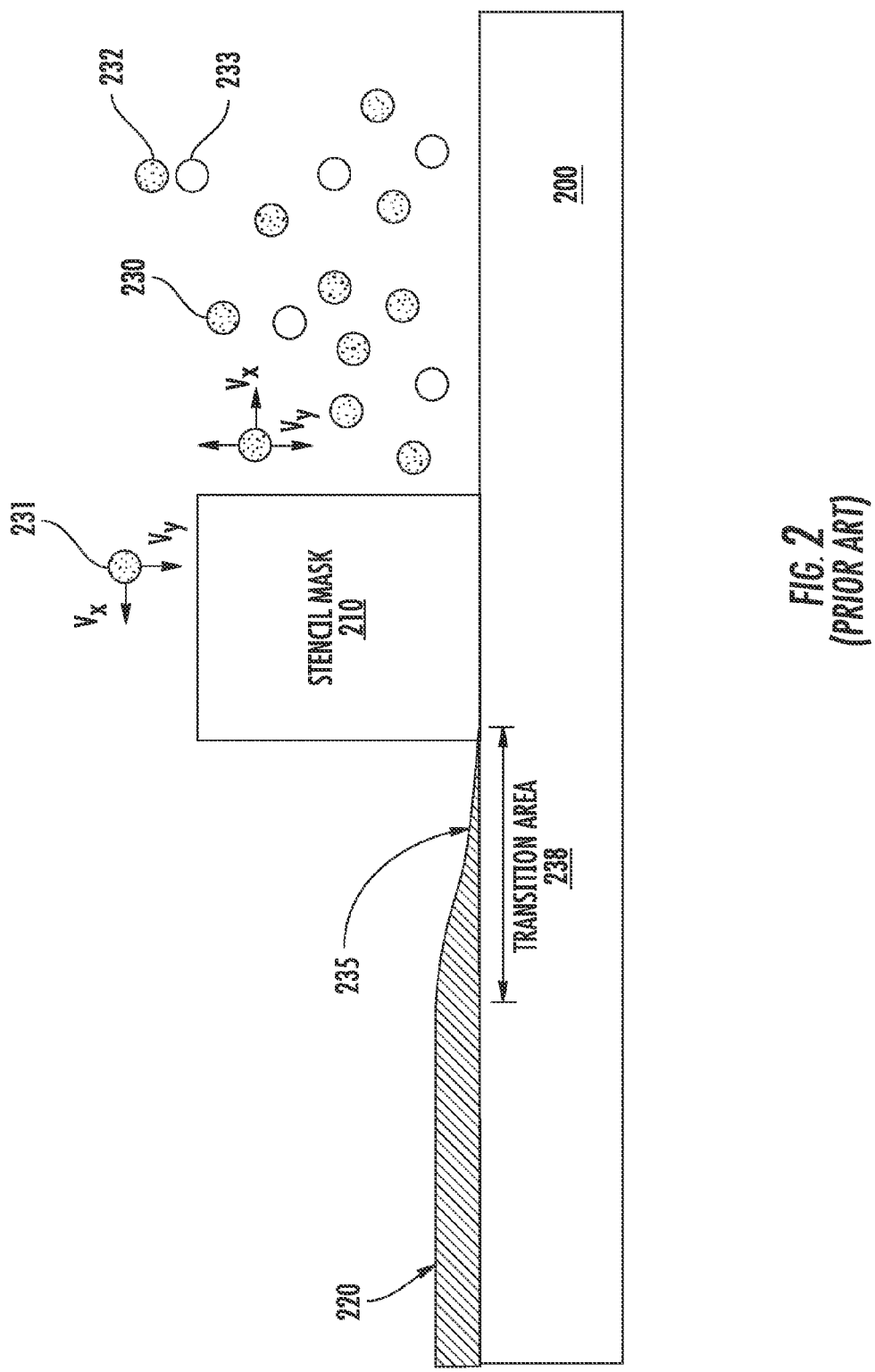
FIG. 2 is a cross sectional view of a deposition step using a stencil mask of the prior art.

As described above, traditional stencil masks, when used in PECVD processes, may create a layer of deposited material having non-uniform thickness. While one particular embodiment is illustrated in FIG. 1, there are numerous other CVD, PECVD, or plasma chambers that can use the embodiments disclosed herein. FIG. 2 shows an example of this phenomenon. A stencil mask 210 is placed atop a workpiece 200. Material is then deposited on the workpiece 200 in the form of ions and neutrals 230. Note that the material can be of one or more species. For example, FIG. 2 shows silicon based species 232, such as $SiH_2$, $SiH_3$ and $SiH_4$, as well as nitrogen based species 233, such as $NH_3$, $NH_2$ and $NH$. As the ions and neutrals 230 drift toward the workpiece 200, each ion and neutral has a drift velocity, which includes a horizontal component ($V_x$) and a vertical component ($V_y$).

Note that the stencil mask 210 affects the path of some ions and neutrals 230 as they drift toward the workpiece 200. Some ions and neutrals have both a $V_x$ and $V_y$, rather than just a $V_y$. For example, molecule 231 has a negative horizontal velocity (i.e. it is moving to the left of FIG. 2) and a downward vertical velocity. In the absence of stencil mask 210, this molecule 231 would be deposited on the workpiece 200, such as at location 235. However, because of the stencil mask 210, this molecule 231 will be deposited atop the stencil mask 210. In other words, stencil mask 210 not only prevents ions and neutrals 230 from being deposited on the portion of the workpiece 200 located beneath the mask 210, but also reduces the deposition of material adjacent to the mask 210. Because of this mask 210, the deposited material 220 has an uneven thickness profile. The thickness is roughly uniform at a distance away from the stencil mask 210. However, in the areas near and adjacent to the mask 210, the thickness of the material 220 is reduced. In some embodiments, there is a transition area 238 where the deposited material 220 transitions from the desired thickness to a lesser thickness at the base of the stencil mask 210.

In some embodiments, the width of the transition area 238 is related to the height of the stencil mask 210 at the interface between the regions to be deposited (i.e. the regions that are not beneath the stencil mask 210) and the regions which are not to be deposited (i.e. the regions beneath the stencil mask 210). As the stencil mask 210 becomes taller, the path of more molecules, such as molecule 231, are affected, thereby modifying their ultimate deposition location.

In other words, the stencil mask 210 creates a shadow that causes uneven deposition of material in those areas affected by this shadow. In PECVD processes, the deposition rate depends on the flux of neutral species to the surface. The deposition rate is lower near the edge of the stencil mask 210 due to this shadowing effect.

FIGS. 3A-C shows cross-sections of a plurality of stencil masks 410, 420, 430. In one test, each of these stencil masks was placed on a silicon wafer prior to entering a PECVD reactor so that a deposition layer could be applied. The conditions associated with the deposition process (duration, species, etc) were held constant for the various tests. The images on the left side of FIGS. 3A-C represent the thickness of the deposited material after the deposition process. For clarity, arrows have been inserted which represent the point at which the thickness of the deposited material reached the desired value. Solid line 400 represents the edge of the respective stencil mask 410, 420, 430. Note that all images are drawn to the same scale, therefore allowing comparisons there between.

In FIG. 3A, a thin beveled stencil mask 410 (i.e. a razor blade) with a tip thickness of less than 10 micrometers, such as about 5 micrometers, is used. The resulting thickness is shown in the image, where the arrow 411 shows the point at which the material thickness is as desired. The distance between arrow 411 and edge 400 represents the transition area 238, as shown in FIG. 2. In FIG. 3B, a slightly thicker stencil mask 420 is used, which has an effective thickness of roughly 30 micrometers. The width of the transition area, defined as the distance between arrow 421 and edge 400 increases with the slightly thicker stencil mask 420. In FIG. 3C, an aluminum piece 430, having a thickness of about 1000 micrometers, is used as the stencil mask in the deposition process. The width of the transition area, defined as the distance between arrow 430 and edge 400 grows considerably in the configuration. For example, the transition area in FIG. 3A is approximately 200 micrometers, while the transition area 238 in FIG. 3B is approximately 500 micrometers and the transition area in FIG. 3C is approximately 1300 micrometers.

Thus, by decreasing the height of the stencil mask at the point where it meets the substrate (i.e. the interface) reduces the transition area. In other words, the height of the stencil mask should be minimized at the interface between the deposited and non-deposited regions of the workpiece. Therefore, by beveling or chamfering the edges of the stencil mask may reduce the transition area, and allow more uniform deposition over the entire workpiece.

Figure 4A:
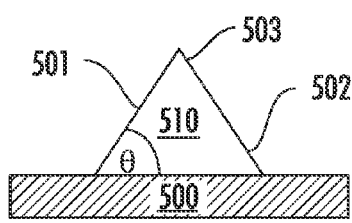
FIGS. 4A-E show various embodiments of a stencil mask in accordance with the disclosure.

FIG. 4A shows a first embodiment of a stencil mask 510 of the present disclosure. A stencil mask 510 can be made from a variety of different materials. In some embodiments, graphite is used since it is easy to machine.

Note that the area of the stencil mask 510 where it meets the workpiece 500 is beveled or chamfered. These terms are meant to represent the scenario where the angle (θ) formed by the intersection of the top surface of the workpiece 500 and the side surfaces 501, 502 of the stencil mask 510 is less than 90°. In some embodiments, this angle is much less than 90°. In some embodiments, decreases in the angle reduce the transition area 238. Thus, in some embodiments, smaller angles may be preferable. In this embodiment, the sloped sidewalls 501, 502 meet at a point 503 on the top of the stencil mask 510.

The range of dimensions for the stencil mask 510 may be quite large. In some embodiments, the stencil mask 510 may be macroscopic (in other words, large enough to be a machined part). In other embodiments, the stencil mask 510 may be on scale lengths that are microscopic. For example, the stencil mask 510 could be generated by semiconductor processing steps. These microscopic masks may be used for e-beam and x-ray lithography.

Figure 4B:
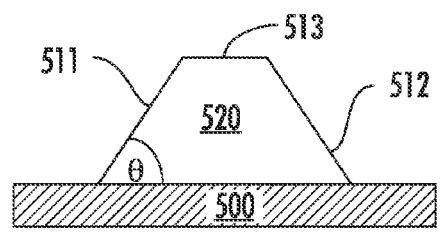

FIG. 4B shows a second embodiment of a stencil mask 520, having a trapezoidal cross-section, where the sloped sidewalls 511, 512 of the stencil mask 520 meet at a flat top surface 513. As described above, the flat top surface 513 and the base of the stencil mask 520 may be of various dimensions. In some embodiments, the angle (θ) formed by the intersection of the top surface of the workpiece 500 and the side surfaces 511, 512 of the stencil mask 520 is much less than 90°.

Figure 4C:
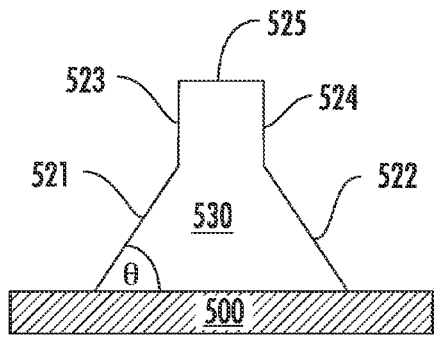

FIG. 4C shows a third embodiment of a stencil mask 530, where the sloped sidewalls 521, 522 merge with vertical upper sidewalls 523, 524, respectively. These vertical upper sidewalls 523, 524 meet at a flat top surface 525. Again, the angle (θ) formed by the intersection of the top surface of the workpiece 500 and the side surfaces 521, 522 of the stencil mask may be much less than 90°.

Figure 4D:
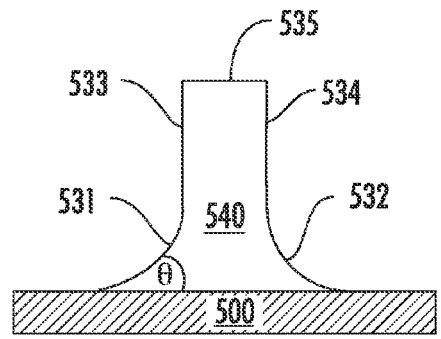

FIG. 4D shows a fourth embodiment of a stencil mask 540 in which the sloped sidewalls 531, 532 are non-planar. In this embodiment, the sidewalls 531, 532 are concave and merge with vertical upper sidewalls 533, 534, respectively. The vertical upper sidewalls 533, 534 meet at a flat top surface 535. Note that the non-planar sidewalls shown in this embodiment can also be used with the embodiments shown in FIGS. 4A-4C as well. In some embodiments, the concave walls are formed through the use of masking and etching. The angle (θ) formed by the intersection of the top surface of the workpiece 500 and the concave side surfaces 531, 532 of the stencil mask is much less than 90°.

Figure 4E:
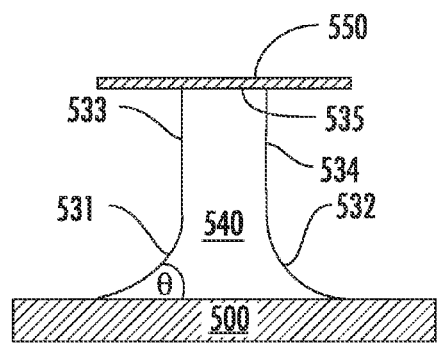

FIG. 4E is a further embodiment of FIG. 4D where a larger flat surface 550 is placed on top of top surface 535. This cross-sectional stencil mask configuration can be created by patterning a film, such as $SiO_2$ patterned with SiN, and performing an isotropic etch, such as with a HF solution. The etch process may be either wet or dry, and serves to undercut the material beneath the film. Films can be patterns with silicon processing and can be made of any material that is compatible/robust with the overall process. For example, the film should preferably not be temperature sensitive. The masking film may be thick enough to withstand the etching process. This thickness may be a function of the etching selectivity and may depend on the process chemistry and conditions.

The overhang created by flat surface 550 is preferably not large enough such that it adversely affects the deposition of material.

This maximum overhang is, in part, a function of the relative height of the mask and the width of the overhang. In other words, a mask at a greater height will be less obtrusive to the deposition process than a mask at a lower height.

The maximum overhang may also be a function of the mean free path of the neutral gas (i.e. the average distance a molecule travels before it hits something). At very low pressures, molecules are more likely to contact a wall. At higher pressures (like those used for CVD), a gas molecule is most likely to hit another gas molecule. Mean free path is given by:

$$\lambda_{MFP} = \frac{1}{n\sigma}$$

where n is the density of gas atoms (or molecules) per unit volume and sigma is the cross-section of interaction (typically measured in $Å^2$.

In other words, at lower pressure, the vertical wall of the mask represents more of a barrier. At higher pressures, the mask can be closer to a gas molecule without affecting the molecule, as it likely colliding with other gas molecules. Thus, the maximum overhang is determined based on both the height of the film 550 relative to the substrate 500, and the operating pressure within the processing chamber.

While the previous embodiments show the stencil mask having a chamfered edge, the disclosure is not limited to this embodiment. For example, the above description states that one way to reduce the transition area is to reduce the height of the mask at the interface between the region to be deposited and the region beneath the stencil mask. FIG. 5 shows another embodiment of a stencil mask 600. In this embodiment, the stencil mask 600 has a thin base 610, having a thickness of $t_1$. A thicker main portion 620, having a thickness of $t_2$, sits atop the base 610. As the height of the mask 600 at the relevant interface has been reduced from a height of $t_2$ to a lesser height of $t_1$, the transition area may be reduced.

Having described numerous embodiments of the stencil mask, the following describes the use of that mask. The stencil mask is machined, such as by conventional equipment. However, the stencil mask is specially machined such that its sidewalls are chamfered or beveled, such that they match the bottom surface at an angle less than 90°, as shown in FIGS. 4A-4E. The stencil mask is then placed on a workpiece, such as a silicon wafer. Subsequently, material is deposited on the workpiece, such as by using conventional deposition processes. The chamfers improve the uniformity of the thickness of the deposited material, as shown in FIG. 3. After the desired thickness of material has been deposited, the process is terminated. The stencil mask is then removed from the workpiece.

In some embodiments, this stencil mask may be advantageously used with solar cells, although the mask may be applied to applications with smaller features. Stencil masks are inexpensive, however they may be not particularly precise, thereby limiting their application in leading edge semiconductor processes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A process for depositing material in a pattern on a workpiece, comprising:
    placing a stencil mask on said workpiece, said stencil mark covering those portions of said workpiece which material is not to be deposited, wherein said stencil mask has non-vertical sidewalls to reduce a shadowing effect;
    performing a plasma enhanced chemical vapor deposition process on said workpiece; and
    removing said stencil mask after said process is completed.

2. The process of claim 1, wherein said non-vertical sidewalls are non-planar and are concave.

3. The process of claim 1, further comprising vertical upper sidewalls and a top surface, wherein said non-vertical sidewalls merge with said vertical upper sidewalls, which meet at said top surface.

4. The process of claim 2, further comprising vertical upper sidewalls and a top surface, wherein said non-vertical sidewalls merge with said vertical upper sidewalls, which meet at said top surface.

5. The process of claim 1, wherein said stencil mask has a trapezoidal cross-section.

6. The process of claim 1, wherein said stencil mask has a triangular cross-section.

* * * * *